(12) United States Patent
Bougaev et al.

(10) Patent No.: US 8,843,330 B2
(45) Date of Patent: Sep. 23, 2014

(54) CHARACTERIZING THE RESPONSE OF A COMPUTER SYSTEM COMPONENT TO VIBRATIONS

(75) Inventors: Anton A. Bougaev, La Jolla, CA (US); Aleksey M. Urmanov, San Diego, CA (US); Kenny C. Gross, San Diego, CA (US); David K. McElfresh, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 1192 days.

(21) Appl. No.: 12/228,407

(22) Filed: Aug. 11, 2008

(65) Prior Publication Data

US 2010/0036621 A1 Feb. 11, 2010

(51) Int. Cl.
*G06F 19/00* (2011.01)
*G01R 9/04* (2006.01)
(52) U.S. Cl.
CPC ........................................ *G01R 9/04* (2013.01)
USPC .............................................................. 702/56
(58) Field of Classification Search
CPC ....................................................... G01R 9/04
USPC .............................................................. 702/56
See application file for complete search history.

(56) References Cited

PUBLICATIONS

N. Tandon, Vibration and noise analysis of computer hard disk drives, Nov. 28, 2005, Elsevier Ltd, p. 16-25.*
F. Gao, Y. Yan, F.F. Yap, Vibro-acoustic interaction of components in hard disk drive under seek process, Microsystem Technologies 9 (2003), p. 496-500, Springer-Verlag 2003.*

\* cited by examiner

*Primary Examiner* — Tung S Lau
(74) *Attorney, Agent, or Firm* — Park, Vaughan, Fleming & Dowler LLP; A. Richard Park

(57) ABSTRACT

Some embodiments of the present invention provide a system that characterizes a response of a component in a computer system to vibrations generated by the computer system. First, the system measures the response of the component to vibrations in a frequency range while the component is located outside of the computer system. The system also measures vibrations generated by the computer system in the frequency range during operation of the computer system, wherein the vibrations are measured at a location in the computer system which is configured to receive the component. The system then characterizes the response of the component to vibrations generated by the computer system based on the measured response of the component to vibrations in the frequency range and the measured vibrations in the frequency range at the location.

20 Claims, 4 Drawing Sheets
(2 of 4 Drawing Sheet(s) Filed in Color)

CHARACTERIZING THE RESPONSE OF A COMPUTER SYSTEM COMPONENT TO VIBRATIONS

BACKGROUND

1. Field

The present invention generally relates to techniques for characterizing a computer system. More specifically, the present invention relates to a method and apparatus that characterizes a response of a component in a computer system to vibrations generated by the computer system.

2. Related Art

Characterizing the response of components in a computer system, such as disk drives, to vibrations generated by the computer system can be important in both designing computer systems and diagnosing problems in computer systems. However, there are many types of disk drives, each of which can be used in many different computer systems, making it a potentially time-consuming and expensive process to test each disk drive with each possible computer system it may be used in. Additionally, a disk drive manufactured after a computer system is placed in the field may never have been operationally tested in the computer system before it is installed. If the operation of the newly manufactured disk drive in the field is impacted by vibrations generated by the computer system, then the performance of the computer system may be reduced and maintenance costs may be increased.

Hence, what is needed is a method and apparatus that characterizes a response of a component in a computer system to vibrations generated by the computer system, without the above-described problems.

SUMMARY

Some embodiments of the present invention provide a system that characterizes a response of a component in a computer system to vibrations generated by the computer system. First, the system measures the response of the component to vibrations in a frequency range while the component is located outside of the computer system. The system also measures vibrations generated by the computer system in the frequency range, wherein the vibrations are measured at a location in the computer system which is configured to receive the component. Next, the system characterizes the response of the component to vibrations generated by the computer system based on the measured response of the component to vibrations in the frequency range and the measured vibrations in the frequency range at the location in the computer system.

In some embodiments, characterizing the response of the component includes dividing a normalized representation of the vibrations generated by the computer system by a normalized representation of the response of the component to vibrations.

In some embodiments, measuring vibrations generated by the computer system includes measuring the vibrations at the location in the computer system using a device with substantially the same form factor and mass distribution as the component.

In some embodiments, the component includes a disk drive.

In some embodiments, the response of the component includes at least one of a read rate and a write rate.

In some embodiments, measuring vibrations generated by the computer system in the frequency range during operation of the computer system includes measuring the vibrations while the computer system is operating in a predetermined range of operational parameters.

In some embodiments, the operational parameters include at least one of a computer system fan speed, a computer system load, a computer system ambient temperature, and an altitude at which the computer system operates.

Some embodiments additionally include a system which measures the response of a set of components to vibrations in the frequency range while each of the components is located outside of the computer system. Next, the system stores the measured responses. Then the system characterizes the response of a given component in the set of components to vibrations generated by the computer system based on the stored measured response of the given component to vibrations in the frequency range and the measured vibrations in the frequency range at the location.

Some embodiments additionally include a system which categorizes the measured response of the component to vibrations in the frequency range based on the response of the component to vibrations at frequencies in the frequency range. This system categorizes the measured vibrations based on the vibrations generated at frequencies in the frequency range.

BRIEF DESCRIPTION OF THE FIGURES

COLOR DRAWINGS

The patent or application file contains at least one drawing executed in color. Copies of this patent or patent application publication with color drawing(s) will be provided by the Office upon request and payment of the necessary fee.

Figure 1A:
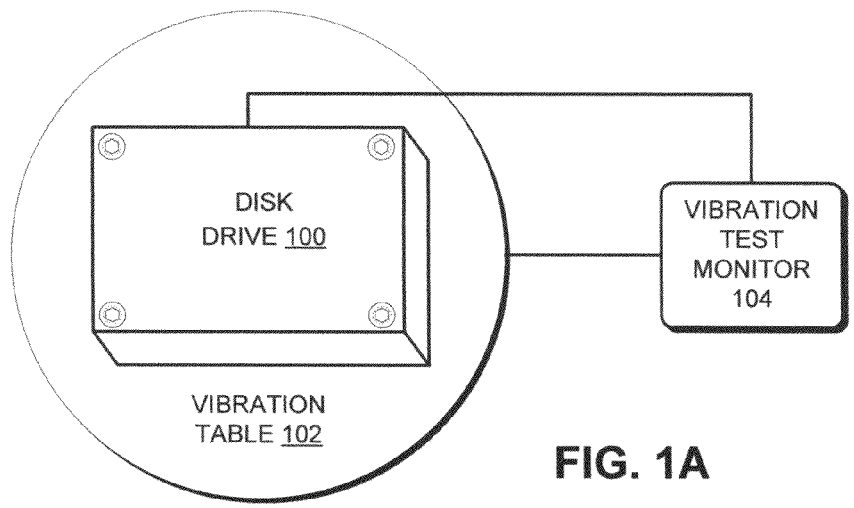

FIG. 1A represents a system that measures a response of a disk drive to vibrations in a frequency range in accordance with some embodiments of the present invention.

Figure 1B:
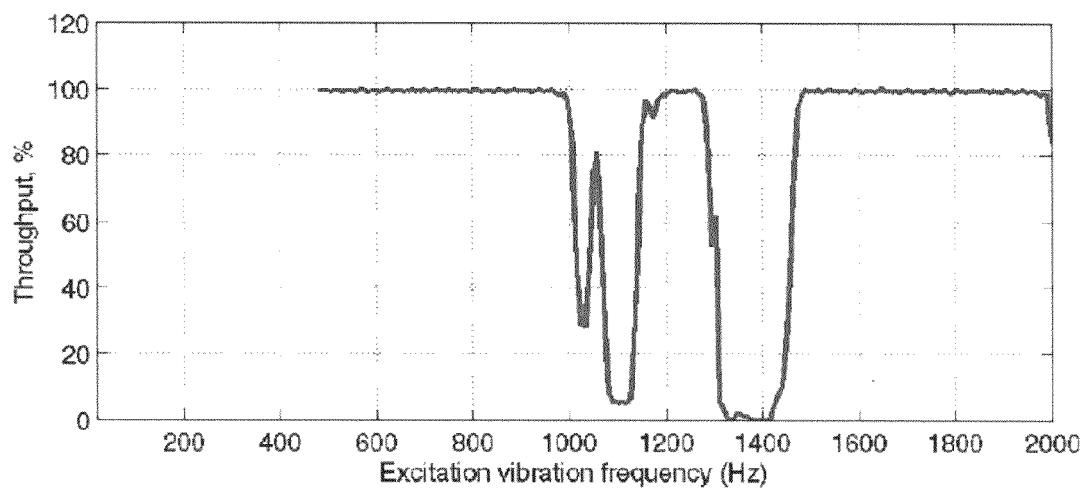

FIG. 1B depicts a graph of the throughput of a disk drive over a vibration frequency range measured using the system of FIG. 1A in accordance with some embodiments of the present invention.

Figure 2A:
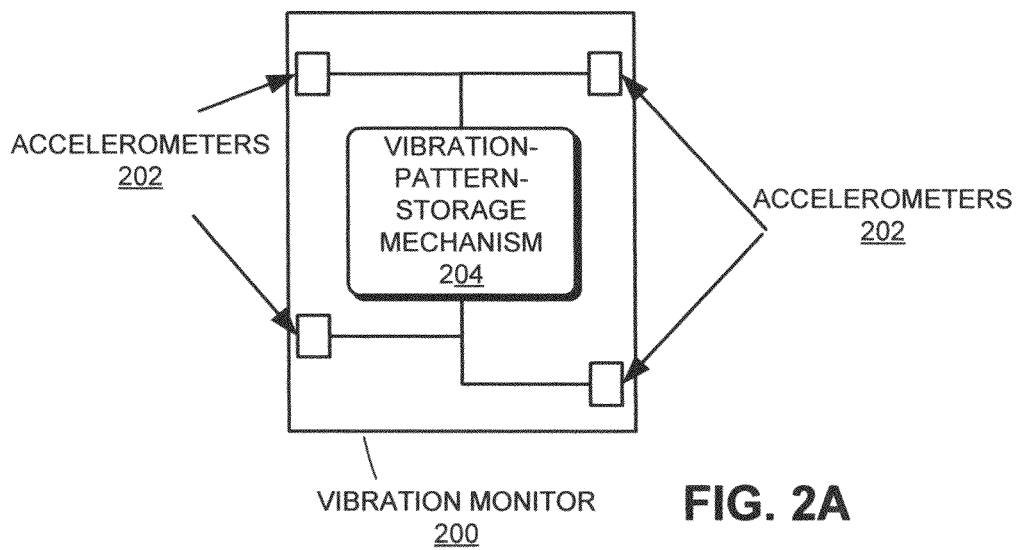

FIG. 2A illustrates a vibration monitor, with substantially the same form factor as a disk drive, that monitors vibrations in a computer system in accordance with some embodiments of the present invention.

Figure 2B:
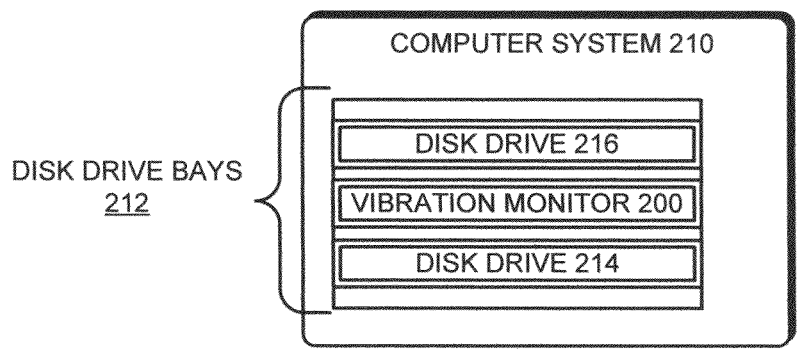

FIG. 2B illustrates a computer system, including a vibration monitor, that monitors vibrations in a computer system in accordance with some embodiments of the present invention.

Figure 2C:
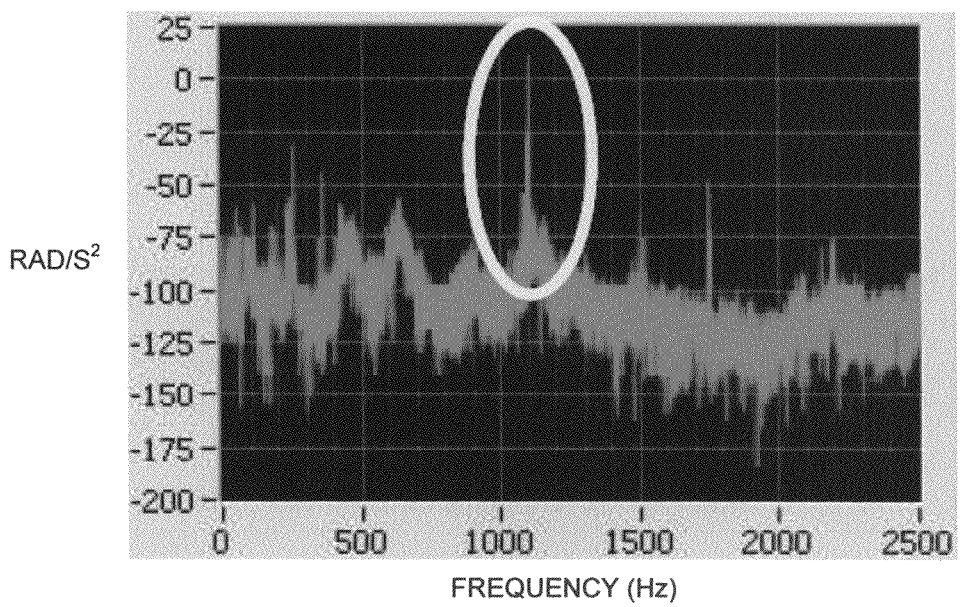

FIG. 2C depicts a graph of the vibrations generated by a computer system over a frequency range measured in accordance with some embodiments of the present invention.

Figure 3A:
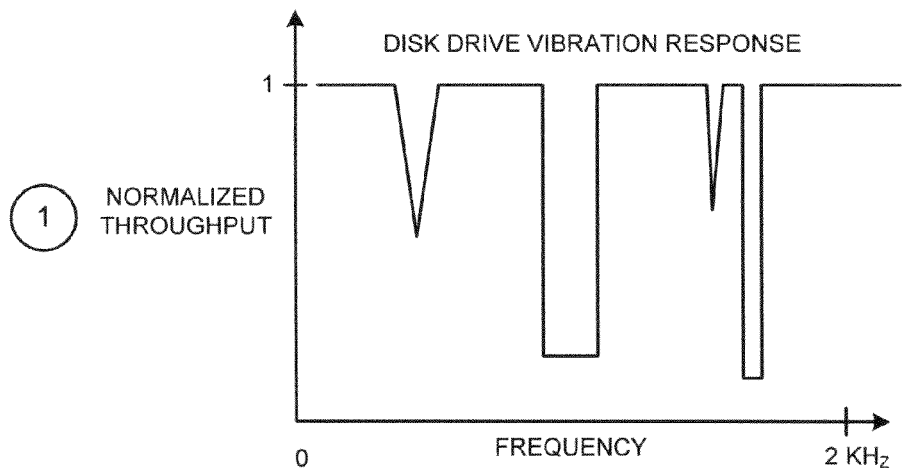

FIG. 3A depicts a normalized graph of the throughput of a disk drive vs. vibration frequency in accordance with some embodiments of the present invention.

Figure 3B:
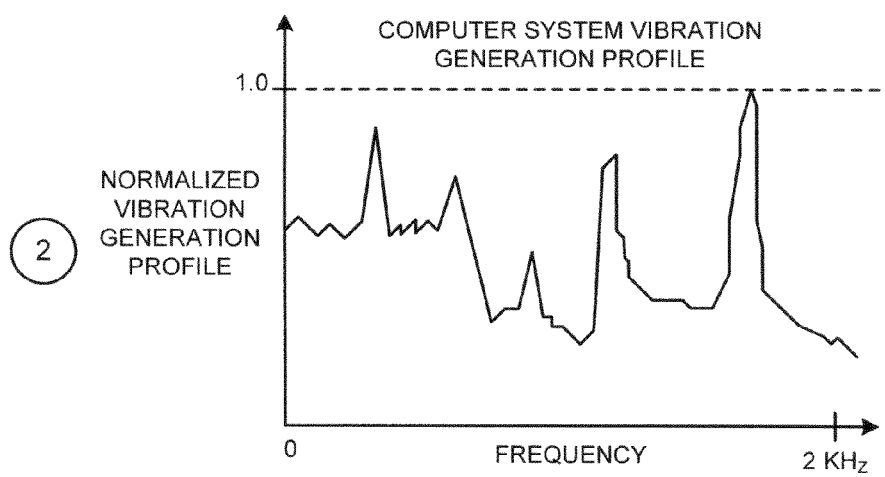

FIG. 3B depicts a normalized graph of the amplitude of vibrations generated by a computer system vs. vibration frequency in accordance with some embodiments of the present invention.

Figure 3C:
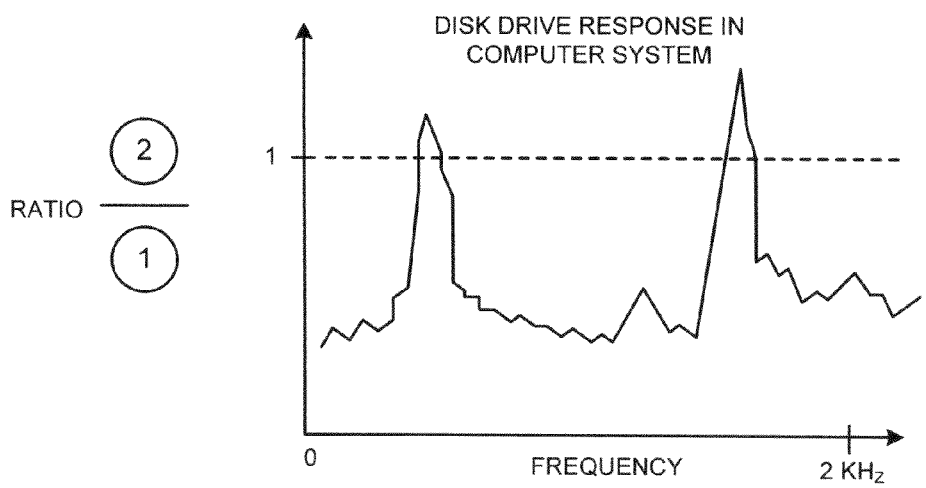

FIG. 3C depicts a normalized graph characterizing the response of a disk drive in a computer system based on the graphs in FIGS. 3A & 3B in accordance with some embodiments of the present invention.

Figure 4:
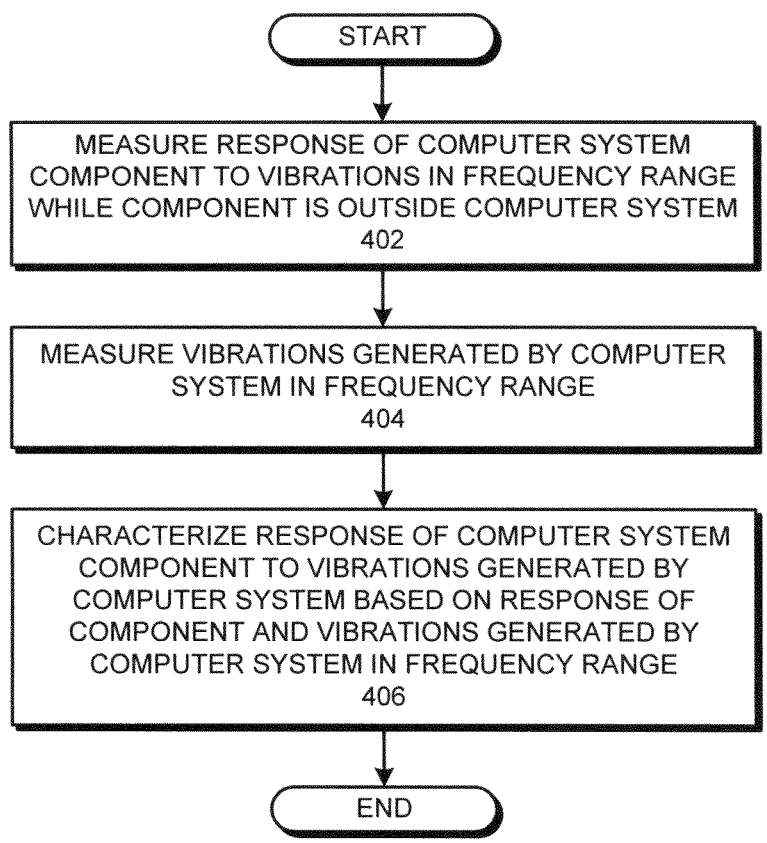

FIG. 4 presents a flowchart illustrating a process for characterizing a response of a component to vibrations generated by a computer system in accordance with some embodiments of the present invention.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

FIG. 1A represents a system that measures a response of a disk drive to vibrations in a frequency range in accordance with some embodiments of the present invention. In FIG. 1A, disk drive 100 is mounted on vibration table 102. Additionally, vibration test monitor 104 is coupled to hard disk drive 100 and vibration table 102.

Disk drive 100 can be any disk drive whose response is desired to be characterized for vibrations generated by a computer system in accordance with embodiments of the present invention. Vibration table 102 can be any vibration table that can generate vibrations in disk drive 100 similar to vibrations generated by a computer system. Moreover, vibration table 102 can be implemented in any technology now known or later developed.

Vibration test monitor 104 can generally include any device that can control vibration table 102 to vibrate over a frequency range and measure a throughput of disk drive 100 over the frequency range. Moreover, vibration test monitor 104 can be implemented in any technology and any combination of hardware and software. In some embodiments, vibration test monitor 104 includes a processor. In some embodiments, vibration test monitor 104 operates on a computer system. In some embodiments, vibration test monitor 104 includes two separate mechanisms, one that controls vibration table 102 and one that measures the throughput of disk drive 100.

During operation, vibration test monitor 104 controls vibration table 102 to vibrate over a frequency range at a predetermined rate. As vibration table 102 sweeps through the frequency range, the throughput of disk drive 100 is monitored. In some embodiments, the monitored throughput over the frequency range is stored in vibration test monitor 104. In other embodiments, the monitored throughput over the frequency range is communicated to another location and stored. In some embodiments, vibration test monitor 104 further processes the information by transforming it into the frequency domain. In some embodiments, transforming the information from the time domain to the frequency domain involves using a fast Fourier transform (FFT). In other embodiments, other transform functions can be used, including, but not limited to, a Laplace transform, a discrete Fourier transform, a Z-transform, and any other transform technique now known or later developed.

In some embodiments, the monitored throughput includes the read rate and/or write rate of disk drive 100. In some embodiments, vibration table 102 rotationally vibrates disk drive 100 through the frequency range, while in other embodiments vibration table 102 linearly vibrates disk drive 100. In some embodiments, disk drive 100 is vibrated along different linear and rotational axes, one at a time, and throughput information is monitored over a frequency range for each axis of vibration. In some embodiments, disk drive 100 is replaced by any other component whose response is desired to be characterized for vibrations generated by a computer system in accordance with embodiments of the present invention.

FIG. 1B depicts a graph of the throughput of disk drive 100 over a rotational vibration frequency range measured using the system of FIG. 1A in accordance with some embodiments of the present invention. FIG. 1B will be discussed below in conjunction with FIG. 2C in accordance with embodiments of the present invention.

FIG. 2A illustrates a vibration monitor, with substantially the same form factor as a disk drive, that monitors vibrations in a computer system in accordance with some embodiments of the present invention. Vibration monitor 200 includes accelerometers 202 coupled to vibration-pattern-storage mechanism 204. Vibration monitor 200 is configured to have substantially the same mass, mass distribution, and form factor as a disk drive so that the monitored vibration pattern is not substantially affected by the replacement of a disk drive with vibration monitor 200.

Accelerometers 202 can be any type of acceleration-measuring device including but not limited to integrated electronics piezoelectric accelerometers, micro-electromechanical systems (MEMS) accelerometers, mechanical or optical accelerometers, remote sensing devices, or any other device or system that can measure acceleration at a specified location. In some embodiments, accelerometers 202 are 3-axis accelerometers that measure acceleration in three orthogonal directions. Accelerometers 202 are placed in vibration monitor 200 on the vertices of a known tetrahedron so that the spatial relationship between the locations of accelerometers 202 is known, and such that all four of accelerometers 202 are not in the same plane and no three of accelerometers 202 form a straight line. In some embodiments, in which vibrations in a predetermined plane are to be measured, three 2-axis accelerometers are used and their axes are placed parallel to the vibration plane to be measured.

Vibration-pattern-storage mechanism 204 is coupled to accelerometers 202 and can be implemented in any technology and any combination of hardware and software. In some embodiments, vibration-pattern-storage mechanism 204 includes a processor. In some embodiments, vibration-pattern-storage mechanism 204 operates on a computer system that vibration monitor 200 is being used in or on a separate computer system. In some embodiments, vibration monitor 200 includes a wired or wireless communication mechanism that communicates information related to the acceleration measurement of accelerometers 202 to a vibration-pattern-storage mechanism located outside of vibration monitor 200.

In some embodiments, vibration monitor 200 includes a mechanism that turns on and off vibration-pattern-storage mechanism 204 and/or accelerometers 202. In some embodiments, vibration-pattern-storage mechanism 204 and/or accelerometers 202 are turned on remotely through a wired or wireless connection, or a connection to the internet that can include a connection through a computer system in which vibration monitor 200 is placed. In some embodiments, vibration-pattern-storage mechanism 204 and/or accelerometers 202 are turned on and off based on predetermined factors that can include but are not limited to one or more of: a time of day; a date; a state of the computer system; or any other event or circumstance. In some embodiments, vibration-patternstorage mechanism 204 can be turned on or off based on vibrations, vibration patterns, accelerations or acceleration patterns detected by one or more of accelerometers 202. For example, in some embodiments, vibration-pattern-storage mechanism 204 only stores vibration patterns that have not previously been detected.

During operation of vibration monitor 200, vibration-pattern-storage mechanism 204 stores information related to the accelerations monitored by each of accelerometers 202. In some embodiments, vibration-pattern-storage mechanism 204 processes the information received from accelerometers 202 and determines the vibration patterns of vibration monitor 200 based on the accelerations measured by each of accelerometers 202. In some embodiments, vibration-pattern-storage mechanism 204 further processes the information by transforming it to the frequency domain. In some embodiments, transforming the vibration information from the time domain to the frequency domain involves using a fast Fourier transform (FFT). In other embodiments, other transform functions can be used, including, but not limited to, a Laplace transform, a discrete Fourier transform, a Z-transform, and any other transform technique now known or later developed.

FIG. 2B illustrates a computer system, including a vibration monitor, that monitors vibrations in a computer system in accordance with some embodiments of the present invention. Computer system 210 includes disk drive bays 212. Disk drive bays 212 include disk drive 214, disk drive 216, and vibration monitor 200.

During operation of computer system 210, vibrations are transmitted to vibration monitor 200. These vibrations include vibrations generated inside computer system 210 by one or more devices including but not limited to disk drive 214, disk drive 216, and any fans or other devices in computer system 210, as well as vibrations generated outside of computer system 210 by outside sources. Vibration monitor 200 monitors vibrations as described above.

In some embodiments, vibration monitor 200 is configured to have substantially the same mass, mass distribution, and form factor as any device in a computer system, including but not limited to a fan, or any other device that can be inserted into a field-replaceable unit (FRU) slot. In some embodiments, accelerometers and a vibration-pattern-storage mechanism are placed directly into a computer system and are not housed in a vibration monitor. In some embodiments, vibrations generated by computer system 210 are measured using any technology now known or later developed for measuring vibrations generated by a computer system.

In some embodiments, vibration monitor 200 monitors vibrations during operation of computer system 210 while computer system 210 is operating over an expected range of operational conditions that can include but are not limited to one or more of the following: ambient temperature, processor load, cooling fan speed, altitude, humidity, rack placement, or any other operating condition of a computer system that can impact the generated vibrations. In some embodiments, vibration monitor 200 is placed in each of the disk drive bays in disk drive bay 212 to monitor vibrations generated by computer system 210.

In some embodiments, information from vibration-pattern-storage mechanism 204 is stored for later use. In some embodiments, the information is communicated to another location for storage. In some embodiments, vibrations from two or more computer systems are stored for later use. In some embodiments, the information stored for later use is categorized based on the generated vibrations. For example, in some embodiments, the information is categorized based on which computer systems generate vibrations at predetermined frequencies. In some embodiments, the information is categorized based on the frequency at which vibrations above a predetermined level are generated. For example, in some embodiments, for all tested computer systems, vibrations above a level of 10 rads/s$^2$ are stored based on the vibration frequency and the computer system generating the vibrations. In this way if a particular vibration frequency is of importance, all test computer systems generating vibrations above a predetermined level can be identified.

FIG. 2C depicts a graph of the amplitude of rotational vibrations generated by a computer system over a frequency range measured in accordance with some embodiments of the present invention. As depicted in FIG. 2C, there is a vibrational peak in the frequency range from 1,000 Hz to 1,500 Hz.

In some embodiments of the invention the response of disk drive 100 to vibrations generated by computer system 210 is characterized by comparing the throughput of disk drive 100 for rotational vibration in a frequency range to the rotational vibration in the frequency range generated by computer system 210. Note that vibrations generated by computer system 210 and represented in FIG. 2C are in the same plane as vibrations represented in throughput graph of FIG. 1B.

FIG. 2C shows a relative rotational vibration peak at about 1,100 Hz. Since FIG. 1B shows a reduction in throughput of disk drive 100 at about 1,100 Hz for rotational vibration in this plane, it is concluded that when disk drive 100 is placed in computer system 210, there may be a reduction in throughput for disk drive 100.

In some embodiments, disk drive 100 is vibration tested in a frequency range at different excitation levels. In some embodiments, the peak excitation levels generated by a computer system over a frequency range are identified and compared to the throughput response for the disk drive at an excitation level equal to or near the peak excitation level generated by the computer system to determine the throughput degradation of the disk drive.

In some embodiments, the throughput degradation for a disk drive across a range of excitation levels over a frequency range is compared to the vibrations generated by a computer system to determine if there may be a reduction in throughput for the disk drive when placed in the computer system.

In some embodiments, the process used to determine the vibrations generated by computer system 210 is used on two or more computer systems. In some embodiments, the process used to determine the throughput degradation for disk drive 100 is used on two or more disk drives. The disk drive throughput over the frequency range measured for each disk drive is compared to the vibrations generated by the two or more computer systems to determine the effect on throughput for each disk drive if the disk drive is placed in any of the two or more computer systems. In some embodiments, the vibrations generated by one or more computer systems are stored based on the vibration level generated at each vibration frequency. In some embodiments, only vibration levels above a certain predetermined level are stored. In some of these embodiments, a disk drive throughput measured in accordance with embodiments of the present invention is characterized based on the vibration frequencies that cause throughput degradation above a predetermined level. These vibration frequencies are then compared to the stored vibration levels generated by tested computer systems to determine which computer systems generate vibrations at frequencies that may reduce the throughput of the disk drive below a predetermined level.

Note that the vibration testing of disk drive 100 and the vibration monitoring of computer system 210 can occur in different locations and at different times. For example, in some embodiments, disk drives are vibration tested by a disk drive manufacturer or test facility during or shortly after the disk drives are produced, while computer systems are monitored for generated vibrations as they are assembled in a different location and at a different time. The vibration test information is used to determine the effect of vibrations generated by the computer systems on the disk drives as described above.

FIGS. 3A, 3B, and 3C depict graphs related to some embodiments of the present invention. FIG. 3A depicts a normalized graph of the throughput of a disk drive vs. frequency in accordance with some embodiments of the present invention. In some embodiments, the graph in FIG. 3A is generated by first generating a graph of disk drive throughput vs. vibration frequency as described above with reference to FIGS. 1A and 1B. Then the graph is normalized so that the maximum throughput is set to one. FIG. 3B depicts a normalized graph of vibrations generated by a computer system vs. vibration frequency in accordance with some embodiments of the present invention. In some embodiments, FIG. 3B is generated by first generating a graph of vibrations generated by a computer system vs. vibration frequency as described with reference to FIGS. 2A, 2B, and 2C above. The graph is then normalized so that the maximum excitation level is set to one. FIG. 3C is then generated by dividing the graph in FIG. 3B by the graph in FIG. 3A. In some embodiments, a predetermined ratio is used as a threshold to indicate that the disk drive throughput may be impacted by vibrations generated by the computer system at a level that is of concern. In some embodiments, a threshold other than 1 is used. In some embodiments, the threshold is determined based on empirical testing or actual feedback from field problems or failures of disk drives.

FIG. 4 presents a flowchart illustrating a process for characterizing a response of a component to vibrations generated by a computer system in accordance with some embodiments of the present invention. The response of a component to vibrations in a frequency range is measured while the component is outside the computer system (step 402). The vibrations generated by a computer system in a frequency range are measured (step 404). Then, the response of the component to vibrations generated by the computer system is characterized based on the response of the component to vibrations in the frequency range and the vibrations generated by the computer system in the frequency range (step 406).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for characterizing a response of a component in a computer system to vibrations generated by the computer system, the method comprising:
   using a computer to measure the response of the component to vibrations in a frequency range while the component is located outside of the computer system;
   during operation of the computer system, measuring vibrations generated by the computer system in the frequency range, wherein the vibrations are measured while the component is absent from the computer system at a location in the computer system that is configured as a mount for coupling the component inside the computer system; and
   characterizing the response of the component to vibrations generated by the computer system based on the measured response of the component to vibrations in the frequency range and the measured vibrations in the frequency range at the location.

2. The method of claim 1, wherein characterizing the response of the component includes:
   dividing a normalized representation of the vibrations generated by the computer system by a normalized representation of the response of the component to vibrations.

3. The method of claim 1, wherein the component includes a disk drive.

4. The method of claim 1, wherein the response of the component includes at least one of:
   a read rate; and
   a write rate.

5. The method of claim 1, wherein measuring vibrations generated by the computer system in the frequency range during operation of the computer system includes measuring the vibrations while the computer system is operating in a predetermined range of operational parameters.

6. The method of claim 1, further comprising:
   measuring the response of a set of components, to vibrations in the frequency range while each of the components in the set of components is located outside of the computer system;
   storing the measured responses for the set of components; and
   characterizing the response of a given component in the set of components to vibrations generated by the computer system based on the stored measured response of the given component to vibrations in the frequency range and the measured vibrations in the frequency range at the location in the computer system.

7. The method of claim 1, further comprising:
   categorizing the measured response of the component to vibrations in the frequency range based on the response of the component to vibrations at frequencies in the frequency range; and
   categorizing the measured vibrations generated by the computer system in the frequency range based on the vibrations generated at frequencies in the frequency range.

8. The method of claim 1, wherein the vibrations generated by the computer system are measured while a device different than the component and with substantially the same form factor and mass distribution as the component is mounted at the location.

9. The method of claim 1, wherein measuring the response of the component to the vibrations comprises vibrating the component at a set of frequencies in the frequency range and recording, in a first profile, one or more throughput values of the component at each frequency in the set of frequencies, and
   wherein measuring the vibrations generated by the computer system comprises recording, in a second profile, vibration values for frequencies in the set that are generated by the computer system while the computer system is operating over an expected range of operating parameters.

10. The method of claim 5, wherein the operational parameters include at least one of:
    a computer system fan speed;
    a computer system load;
    a computer system ambient temperature; and
    an altitude at which the computer system operates.

11. The method of claim 8, wherein the component comprises a disk drive, and wherein the device does not comprise a disk drive.

12. The method of claim 9, wherein characterizing the response of the component comprises:
    normalizing the first profile so that a maximum value for the throughput values in the first profile equals a given value;
    normalizing the second profile so that a maximum value for the vibration values in the second profile equals the given value;
    generating a third profile by dividing the second profile with the first profile; and
    using the third profile and a predetermined ratio to determine a level of impact of the vibrations generated by the computer system to a throughput of the component.

13. The method of claim 9, wherein the operating parameters comprise at least one of a load for the computer system and an ambient temperature for the computer system.

14. A computer-readable storage medium storing instructions that when executed by a computer cause the computer to perform a method for characterizing a response of a component in a computer system to vibrations generated by a computer system, the method comprising:
    measuring the response of the component to vibrations in a frequency range while the component is located outside of the computer system;
    during operation of the computer system, measuring vibrations generated by the computer system in the frequency range, wherein the vibrations are measured while the component is absent from the computer system at a location in the computer system that is configured as a mount for coupling the component inside the computer system; and
    characterizing the response of the component to vibrations generated by the computer system based on the measured response of the component to vibrations in the frequency range and the measured vibrations in the frequency range at the location in the computer system.

15. The computer-readable storage medium of claim 14, wherein characterizing the response of the component includes:
    dividing a normalized representation of the vibrations generated by the computer system by a normalized representation of the response of the component to vibrations.

16. The computer-readable storage medium of claim 14, wherein the response of the component includes at least one of:
    a read rate; and
    a write rate.

17. The computer-readable storage medium of claim 14, further comprising:
    measuring the response of a set of components, to vibrations in the frequency range while each of the components in the set of components is located outside of the computer system;
    storing the measured responses for the set of components; and
    characterizing the response of a given component in the set of components to vibrations generated by the computer system based on the stored measured response of the given component to vibrations in the frequency range and the measured vibrations in the frequency range at the location.

18. The computer-readable storage medium of claim 14, further comprising:
    categorizing the measured response of the component to vibrations in the frequency range based on the response of the component to vibrations at frequencies in the frequency range; and
    categorizing the measured vibrations generated by the computer system in the frequency range based on the vibrations generated at frequencies in the frequency range.

19. An apparatus that characterizes a response of a disk drive to vibrations generated by a computer system, the apparatus comprising:
    a disk-drive-measuring mechanism configured to measure the response of the disk drive to vibrations in a frequency range while the disk drive is located outside of the computer system;
    a computer-system-vibration-measuring mechanism configured to, during operation of the computer system, measure vibrations generated by the computer system in the frequency range, wherein the vibrations are measured while the component is absent from the computer system at a location in the computer system that is configured as a mount for coupling the component inside the computer system; and
    a characterizing mechanism configured to characterize the response of the disk drive to vibrations generated by the computer system based on the measured response of the disk drive to vibrations in the frequency range and the measured vibrations in the frequency range at the location.

20. The apparatus of claim 19, further comprising:
    a disk-drive-response-categorizing mechanism configured to categorize the measured response of the disk drive to vibrations in the frequency range based on the response of the disk drive to vibrations at frequencies in the frequency range; and
    a computer-system-vibration-categorizing mechanism configured to categorize the measured vibrations generated by the computer system in the frequency range based on the vibrations generated at frequencies in the frequency range.

\* \* \* \* \*